United States Patent
Feng

(10) Patent No.: US 7,472,362 B1
(45) Date of Patent: Dec. 30, 2008

(54) METHOD OF MINIMIZING PHASE NOISE

(75) Inventor: Kai Di Feng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/060,162

(22) Filed: Mar. 31, 2008

(51) Int. Cl.
- G06F 17/50 (2006.01)
- G06F 19/00 (2006.01)
- G01R 29/26 (2006.01)
- G01R 35/00 (2006.01)

(52) U.S. Cl. .................. 716/4; 716/2; 703/14; 702/69; 702/106; 702/191

(58) Field of Classification Search .................... 716/4, 716/2; 703/14; 702/69, 106, 191
See application file for complete search history.

(56) References Cited

U.S. PATENT DOCUMENTS

| | | | |
|---|---|---|---|
| 4,363,138 A * | 12/1982 | Franklin et al. ........... | 455/226.2 |
| 5,909,661 A | 6/1999 | Abramovitch et al. ...... | 702/191 |
| 6,327,542 B1 | 12/2001 | McBride ..................... | 702/64 |
| 6,915,503 B1 | 7/2005 | Lesea .......................... | 716/16 |
| 7,181,711 B2 * | 2/2007 | Foreman et al. ................ | 716/6 |
| 7,292,947 B1 * | 11/2007 | Tabatabaei et al. ............ | 702/69 |
| 7,310,593 B2 * | 12/2007 | Hammerschmidt ......... | 702/189 |
| 7,313,176 B1 | 12/2007 | Groen ......................... | 375/219 |
| 7,321,847 B1 * | 1/2008 | Welkie et al. ................ | 702/199 |
| 2005/0107970 A1 * | 5/2005 | Franch et al. .................. | 702/79 |
| 2005/0111536 A1 * | 5/2005 | Cranford et al. ............. | 375/226 |
| 2005/0246142 A1 * | 11/2005 | Hammerschmidt ......... | 702/189 |
| 2006/0202714 A1 | 9/2006 | Hoang et al. ................... | 326/38 |
| 2006/0248485 A1 * | 11/2006 | Foreman et al. ................. | 716/6 |
| 2007/0100596 A1 * | 5/2007 | Hollis .......................... | 703/14 |
| 2007/0233444 A1 * | 10/2007 | O'Mahony et al. ............ | 703/14 |

* cited by examiner

Primary Examiner—Phallaka Kik
(74) Attorney, Agent, or Firm—Zilka-Kotab, PC

(57) ABSTRACT

A method of minimizing phase noise is provided. In operation, a first phase noise in a first circuit located on an integrated circuit is determined. Additionally, a second phase noise in a second circuit coupled to the first circuit but which is not located in the integrated circuit is determined, the second circuit being programmable. Further, the first phase noise is compared with the second phase noise. If the phase noises are about the same, it is determined that the noise source is from an algorithm of a random number generator, the second circuit is modified to optimize the performances of the integrated circuit, and the modified second circuit is copied to the first circuit. If the phase noises are different, it is determined that a source of the phase noise is at least one of a power supply coupling and a substrate coupling in the integrated circuit.

1 Claim, 3 Drawing Sheets

METHOD OF MINIMIZING PHASE NOISE

BACKGROUND

The present invention relates to circuits, and more particularly, this invention relates to the high efficient development method including determining the main source of phase noise, minimizing phase noise and optimizing other performances in circuits.

The integrated circuit of a fractional-N phased-lock-loop (PLL) is widely used in communication systems. Such circuits feature high frequency resolution without degrading locking time. The conventional fractional-N PLL needs the long development time to meeting the two main performances: phase noise and spur. Any modification in the circuits will take very long manufacture time. One tape out usually may take three months or more manufacture time. It is desirable to obtain the maximum information on determining the phase noise source, minimizing the phase noise, and reducing the spurs. Furthermore, it is desirable to find the phase noise sources and determine the main phase noise source because of the multiple phase noise sources in the system. One source is from the algorithm of a random number generator. Often, the random number uses an algorithm called MASH (multiple stage noise shaping) to shape the noise to a high frequency. A loop filter is then expected to filter out the noise.

In some cases, the random number generator may be a digital circuit which generates wide band noise which couples to the other part of PLL through a power supply and substrate. Finding the actual source of the noise, however, is very difficult.

SUMMARY

A method of minimizing phase noise is provided. In operation, a first phase noise in a first circuit located on an integrated circuit is determined. Additionally, a second phase noise in a second circuit coupled to the first circuit but which is not located in the integrated circuit is determined, the second circuit being programmable. Further, the first phase noise is compared with the second phase noise. If the phase noises are about the same, it is determined that the noise source is from an algorithm of a random number generator, the second circuit is modified to optimize the performances of the integrated circuit, and the modified second circuit is copied to the first circuit. If the phase noises are different, it is determined that a source of the phase noise is at least one of a power supply coupling and a substrate coupling in the integrated circuit.

Other aspects, advantages and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a method is provided. In operation, a first phase noise in a first circuit located on an integrated circuit is determined. Additionally, a second phase noise in a second circuit coupled to the first circuit but which is not located in the integrated circuit is determined, the second circuit being programmable. Furthermore, the first phase noise is compared with the second phase noise. If the phase noises are about the same, it is determined that the noise source is from an algorithm of a random number generator and the algorithm of the second circuit is modified to shape the random number spectrum to the high frequency further more and to optimize the other performances of the integrated circuit, for example, spur. Then the optimized second circuit is copied to the first circuit for the next hardware tape out. If the phase noises are different, it is determined that a source of the phase noise is a power supply and/or the substrate coupling in the integrated circuit. Then the decoupling of the power supply and substrate should be enhanced for the next hardware tape out.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1:
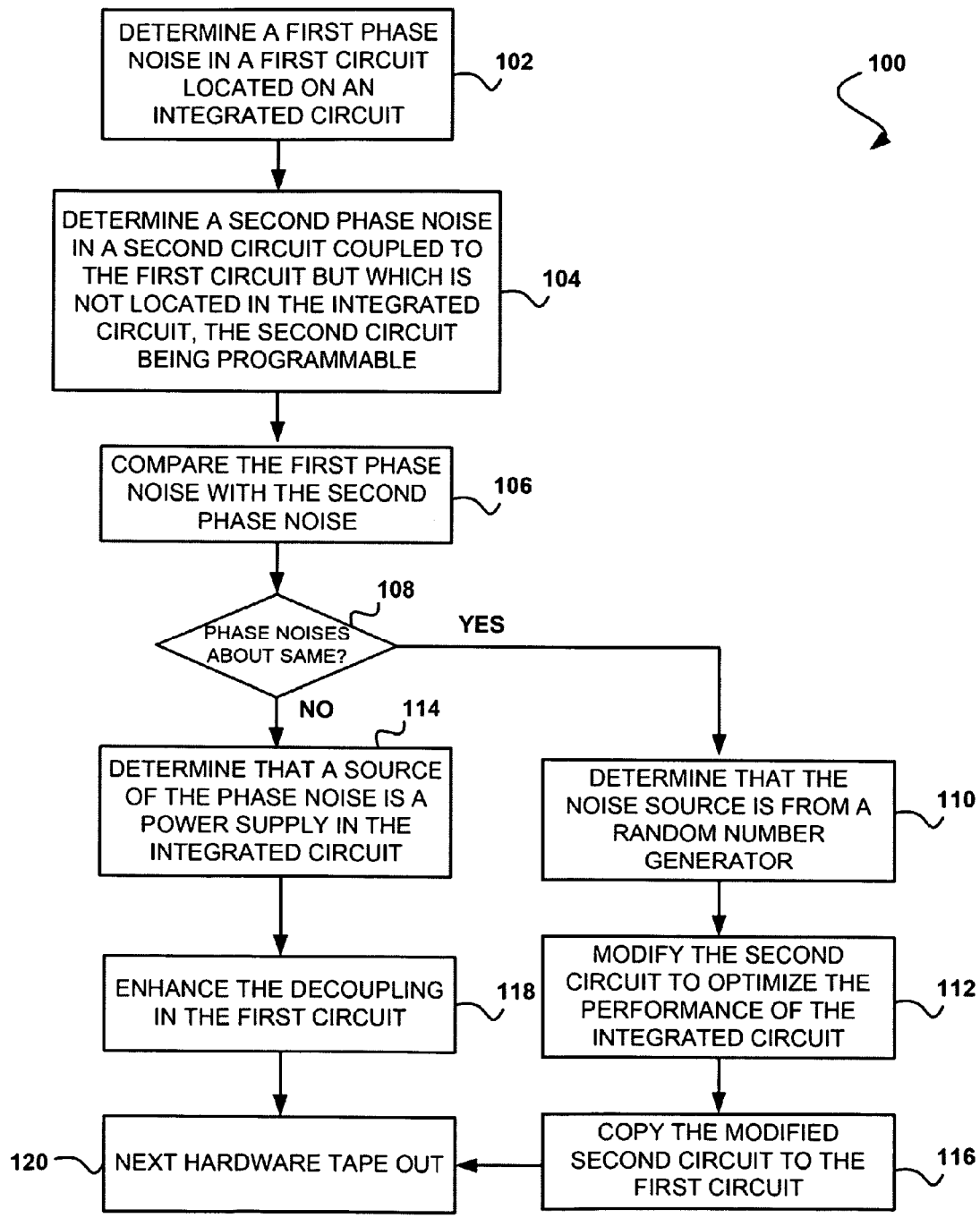
FIG. 1 shows a method for determining a source of phase noise in a circuit, in accordance with one embodiment.

FIG. 1 shows a method 100 for determining a source of phase noise in a circuit, in accordance with one embodiment. As shown, a first phase noise in a first circuit located on an integrated circuit is determined. See operation 102.

Additionally, a second phase noise in a second circuit coupled to the first cirrus which is not located in the integrated circuit is determined, the second circuit being programmable. See operation 104. Furthermore, the first phase noise is compared with the second phase noise. See operation 106. If the phase noises are about the same, it is determined that the noise source is from a random number generator and the second circuit is modified to optimize the performance of the integrated circuit. See operations 108, 110, and 112. Furthermore, the modified second circuit is copied to the first circuit. See operation 116. Additionally, the decoupling of the power supply and substrate is be enhanced for the next hardware tape out. See operation 120. If the phase noises are different, it is determined that a source of the phase noise is a power supply in the integrated circuit and the decoupling in the first circuit is enhanced. See operations 114 and 1118. In this way, a main noise source may be determined and eliminated from a power supply coupling and substrate coupling of a system.

Figure 2:
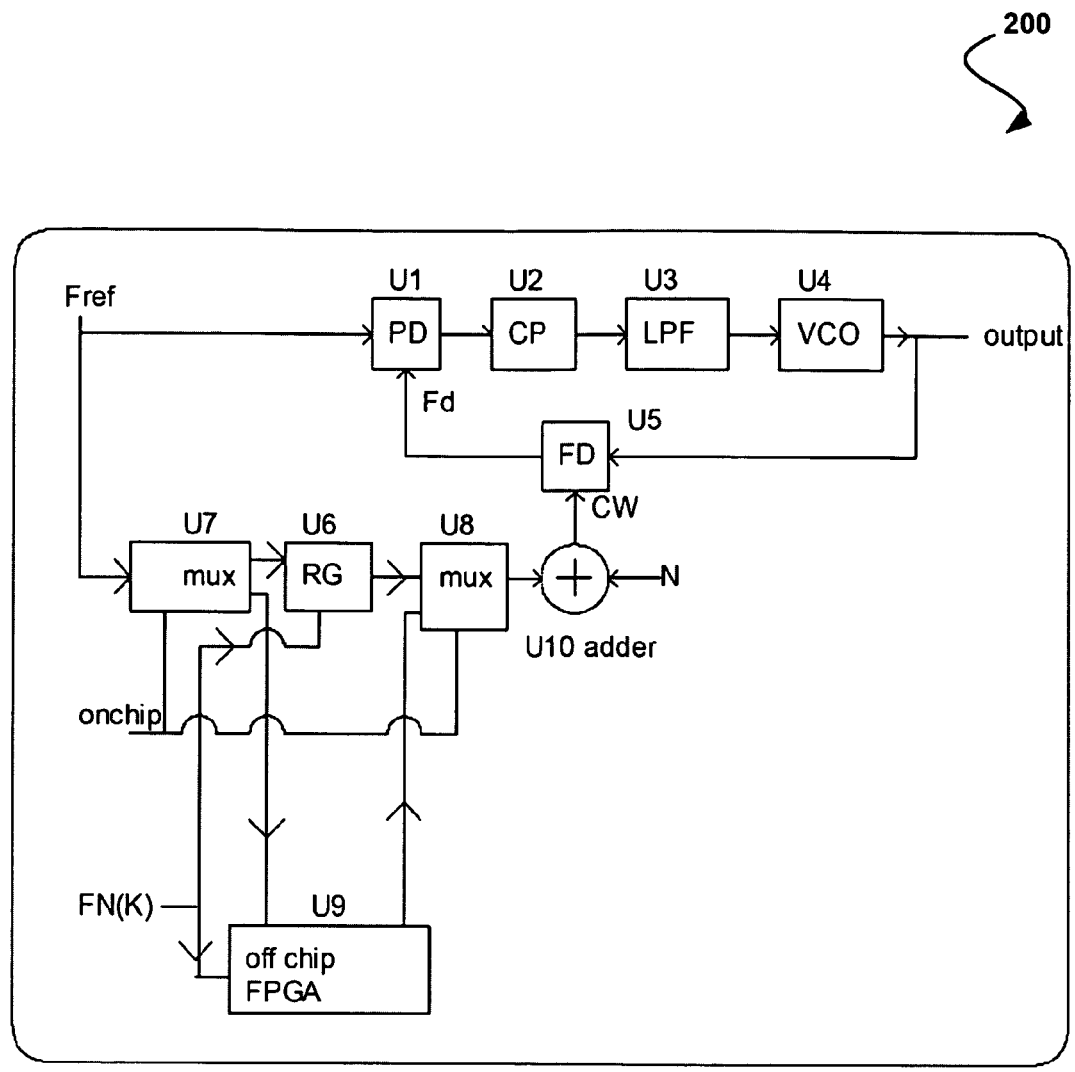
FIG. 2 shows a block diagram of a fractional-N phased-lock-loop (PLL) system, in accordance with one embodiment.

FIG. 2 shows a block diagram of a fractional-N phased-lock-loop (PLL) system 200, in accordance with one embodiment. As shown, a reference frequency "Fref," a phase detector (PD) U1, a charge pump (CP) U2, a filter (LPF) U3, a voltage control oscillator (VCO) U4, a frequency divider (FD) U5, and a random number generator (RG) U6 are provided. In normal operation, the random number generator generates a signed random number for each clock of Fref. FN(K) is a K bit input bus of RG. When the bus is specified a number of L, the mean value of the random numbers approach $u=L/2^K$. The random number and a fixed integer N are added, and the sum is control word "CW" of frequency divider such that the frequency divide ratio is N.u and the output frequency Fout=N.u*Fref.

As shown further, an off chip field-programmable gate array (FPGA) U9 is provided. In this case, the FPGA is initially coded the same digital circuit as in the random number generator U6. Two digital multiplexers U7 and U8, under control of a mode control signal "onchip," are also provided. When the mode control signal "onchip" is at logic high, the random number generator U6 is activated, Fref is input to the random number generator U6, and a random number generator U6 output is connected to the adder. When "onchip" is at logic low, the random number generator U6 is completely inactivated while the FPGA U9 is activated, Fref is input to the FPGA U9, and the FPGA U9 output is connected to the adder U10. In this case, the power supply of FPGA U9 is separated from the fractional-N PLL and no substrate noise coupling between U9 and the rest circuits of the fractional-N PLL.

When the system operates in off chip mode, there is no power supply or substrate coupling. Thus, the phase noise of the two modes may be measured. If the phase noise of the two modes is the same, the noise source is from the random number generator. The next step is to modify the code of the FPGA until the phase noise can meet the specification. If the phase noise of the two modes is different, the noise source is from the on chip power supply coupling and/or the substrate coupling, and the next step is enhance the decoupling of on chip power supply and the isolation of the layout. In this way, using the system 200, a main noise source may be determined and eliminated from a power supply and substrate.

Figure 3:
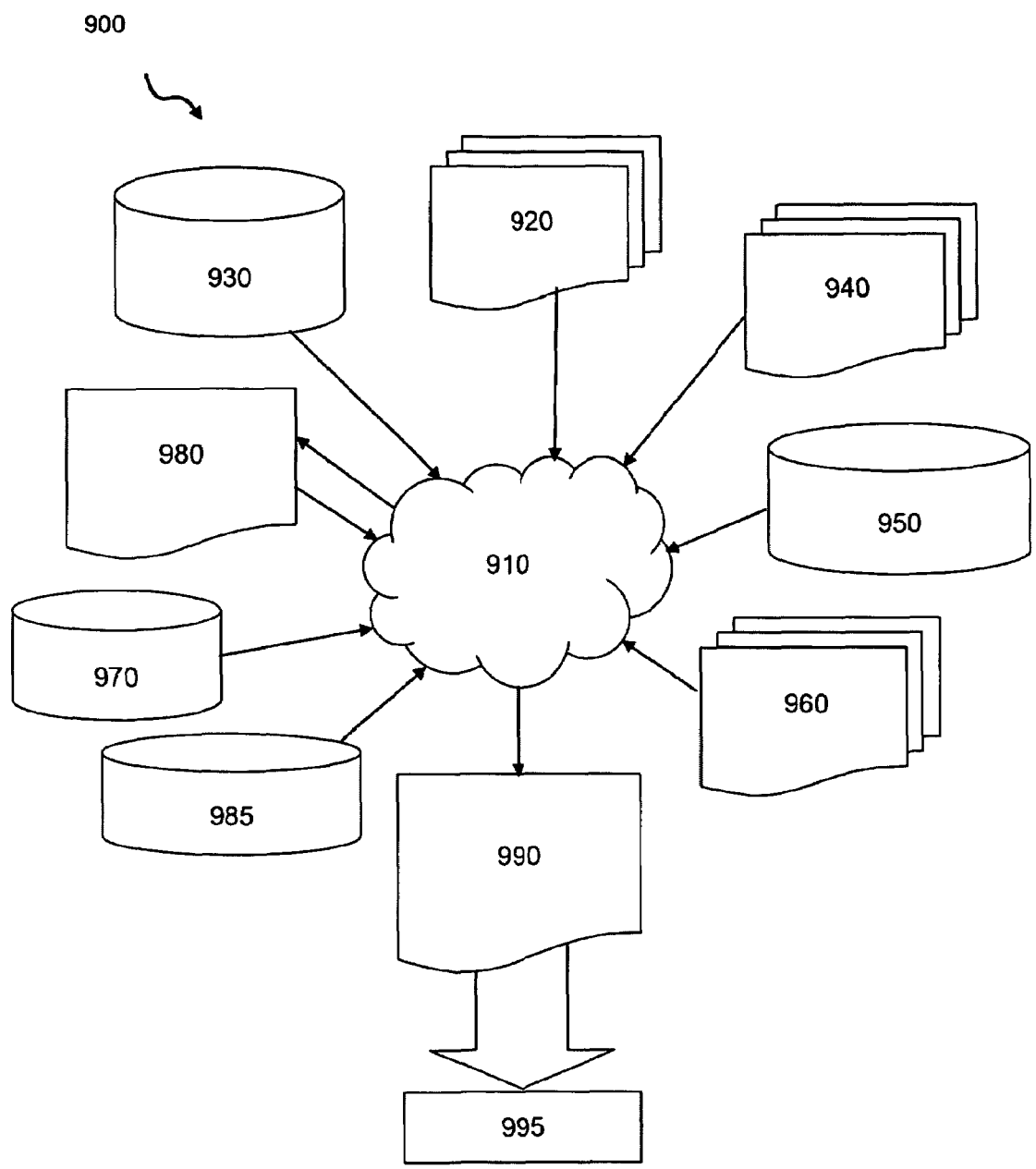
FIG. 3 is a flow diagram of a design process used in semiconductor design, manufacture, and/or test.

FIG. 3 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1 and 2 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1 and 2. Design process 910 preferably synthesizes (or translates) an embodiment of the invention as shown in FIGS. 1 and 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1 and 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GLI, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    determining a first phase noise in a first circuit located on an integrated circuit;
    determining a second phase noise in a second circuit coupled to the first circuit but which is not located in the integrated circuit, the second circuit being programmable;
    comparing the first phase noise with the second phase noise;
    if the phase noises are about the same:
        determining that a noise source is from an algorithm of a random number generator; and
        modifying the second circuit to optimize performances of the integrated circuit;
        copying the modified second circuit to the first circuit; and
    if the phase noises are different, determining that a source of the phase noise is at least one of a power supply coupling and a substrate coupling in the integrated circuit.

* * * * *